United States Patent
Guidash et al.

(10) Patent No.: US 7,342,213 B2
(45) Date of Patent: Mar. 11, 2008

(54) CMOS APS SHARED AMPLIFIER PIXEL WITH SYMMETRICAL FIELD EFFECT TRANSISTOR PLACEMENT

(75) Inventors: R. Michael Guidash, Rochester, NY (US); Timothy J. Kenney, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/432,573

(22) Filed: May 11, 2006

(65) Prior Publication Data

US 2006/0273241 A1    Dec. 7, 2006

Related U.S. Application Data

(60) Provisional application No. 60/686,103, filed on Jun. 1, 2005.

(51) Int. Cl.
*H01L 27/00* (2006.01)

(52) U.S. Cl. .............. 250/208.1; 250/214 DC; 250/214 R; 250/214.1; 348/308

(58) Field of Classification Search ............. 250/208.1, 250/214 DC, 214.1, 214 R; 348/230.1, 294, 348/300, 301, 302, 307, 308, 320, 322
See application file for complete search history.

(56) References Cited

U.S. PATENT DOCUMENTS

| | | | |
|---|---|---|---|
| 6,423,994 B1 | 7/2002 | Guidash | |
| 6,466,266 B1 * | 10/2002 | Guidash et al. | 348/308 |
| 6,657,665 B1 * | 12/2003 | Guidash | 348/308 |
| 6,734,906 B1 | 5/2004 | Hashimoto | |
| 6,956,605 B1 | 10/2005 | Hashimoto | |
| 2004/0184042 A1 * | 9/2004 | Kobayashi | 356/638 |
| 2005/0237405 A1 * | 10/2005 | Ohkawa | 348/308 |
| 2006/0256221 A1 * | 11/2006 | Mckee et al. | 348/308 |

FOREIGN PATENT DOCUMENTS

| | | |
|---|---|---|
| EP | 0 708 555 A2 | 4/1996 |
| JP | 2000-059697 | 2/2000 |

* cited by examiner

*Primary Examiner*—Georgia Epps
*Assistant Examiner*—Francis M LeGasse, Jr.
(74) *Attorney, Agent, or Firm*—Peyton C. Watkins

(57) ABSTRACT

An image sensor includes a plurality of photodetectors arranged in an array; and a plurality of transistors that are functionally shared by the photodetectors, wherein a distance of each photodetector to an adjacent transistor is substantially the same.

8 Claims, 5 Drawing Sheets

CMOS APS SHARED AMPLIFIER PIXEL WITH SYMMETRICAL FIELD EFFECT TRANSISTOR PLACEMENT

CROSS-REFERENCE TO RELATED APPLICATIONS

Reference is made to and priority claimed from U.S. Provisional Application Ser. No. 60/686,103, filed Jun. 1, 2005, entitled CMOS APS SHARED AMPLIFIER PIXEL WITH SYMMETRICAL FET PLACEMENT.

FIELD OF THE INVENTION

The invention relates generally to the field of CMOS image sensors having a plurality of photodiodes sharing an amplifier, and more particularly, to such CMOS image sensors having the Field Effect Transistors (FETs) positioned a substantially identical distance from each photodiode in the "unit cell" of the image sensor.

BACKGROUND OF THE INVENTION

Referring to FIG. 1, there is shown a schematic diagram of two photodiodes sharing an amplifier, the source follower transistor SF. The photodiodes transfer their charge to their respective floating diffusions FD1 and FD2 via their respective transfer gates TG1 and TG2.

Referring to FIG. 2, there is shown a schematic of a typical prior art image sensor having four photodiodes PD1, PD2, PD3 and PD4 shared by an amplifier, the source follower SF. Similar to FIG. 1, the operation of FIG. 2 includes the photodiodes PD1, PD2, PD3 and PD4 transferring their charge to their respective floating diffusions FD1, FD2, FD3 and FD4 via their respective transfer gates TG1, TG2, TG3 and TG4.

Referring to FIGS. 3 and 4, there are respectively shown top views of FIGS. 1 and 2. The image sensor includes the plurality of photodiodes and their associated Field Effect Transistors (FETs) placed asymmetrically within the image sensor unit cell and at various distances from the photodiodes. The FETs function to provide various functions for the image sensor such as amplification, reset and row selection. The design of FIGS. 1 and 2 maximizes the optical fill factor, but it can also have optical gain fixed pattern noise due to optical and electrostatic asymmetry of the regions surrounding each photodiode.

Although the prior art image sensor is satisfactory, it includes drawbacks such as optical gain fixed pattern noise. Therefore, a need exists for reducing this optical gain fixed noise pattern while maximizing optical fill factor.

SUMMARY OF THE INVENTION

The present invention is directed to overcoming one or more of the problems set forth above. Briefly summarized, according to one aspect of the present invention, the invention resides in an image sensor including a plurality of photodetectors arranged in an array; and a plurality of FETs that are functionally shared by the photodetectors, wherein a distance of each photodetector to an adjacent FET is substantially the same.

The above and other objects of the present invention will become more apparent when taken in conjunction with the following description and drawings wherein identical reference numerals have been used, where possible, to designate identical elements that are common to the figures.

Advantageous Effect of the Invention

The present invention provides the advantage of reducing the gain fixed noise in shared amplifier pixels.

DETAILED DESCRIPTION OF THE INVENTION

In the following description, the present invention will be described in the preferred embodiment as a software program. Those skilled in the art will readily recognize that the equivalent of such software may also be constructed in hardware.

Figure 1:
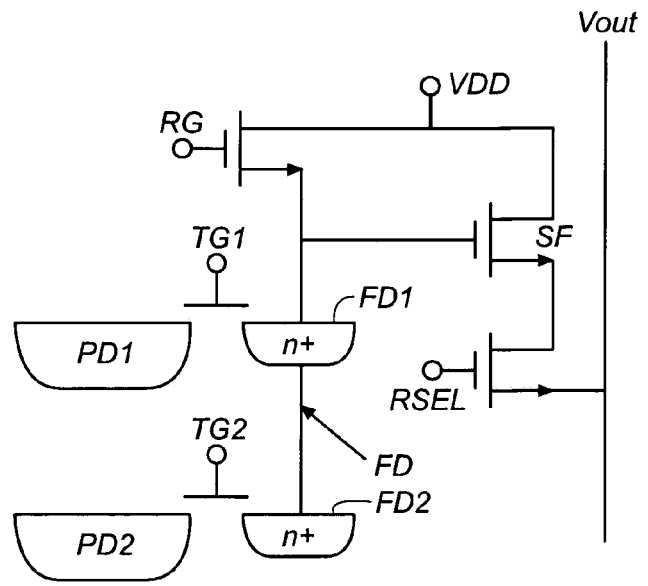
FIG. 1 is a schematic diagram of a prior art image sensor illustrating two photodiodes sharing an amplifier and the location of FETs.
Figure 2:
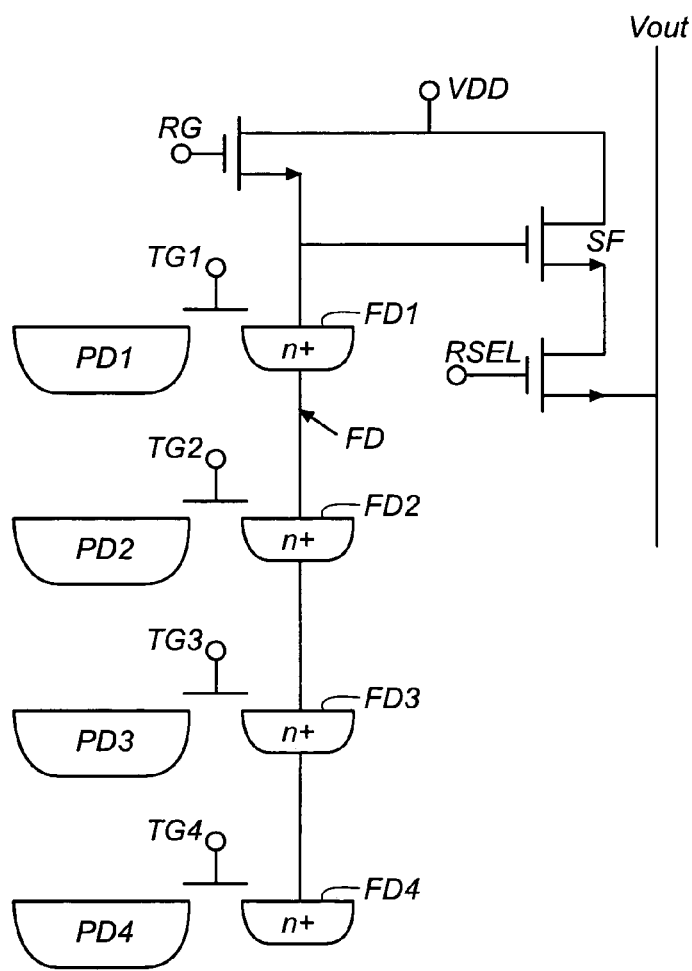
FIG. 2 is a schematic diagram of a prior art image sensor illustrating four photodiodes sharing an amplifier and the location of FETs.
Figure 4:
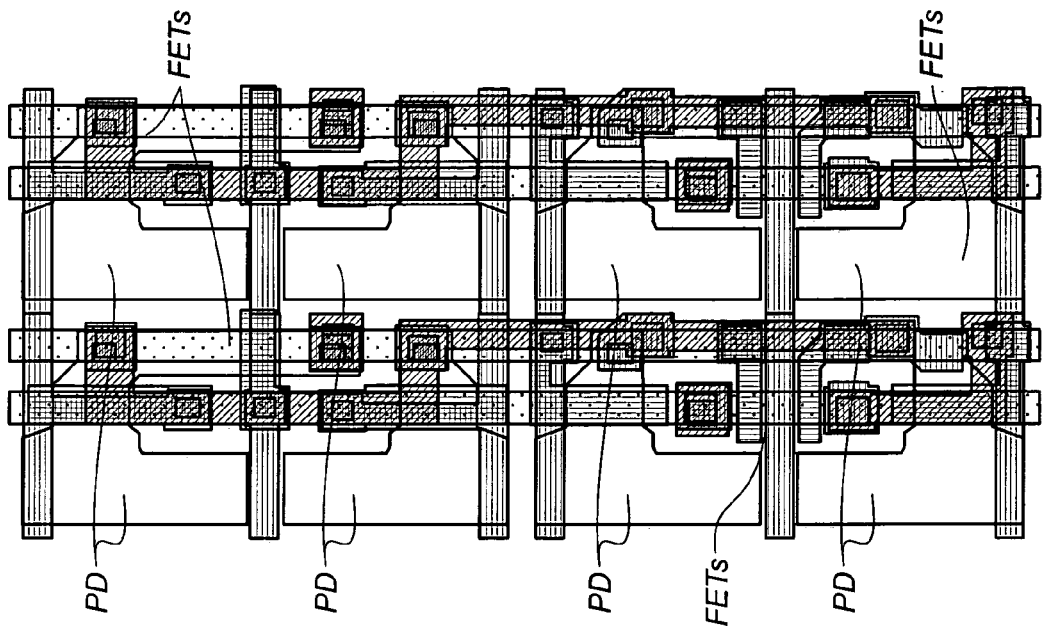
FIG. 4 is a top view of FIG. 2.
Figure 3:
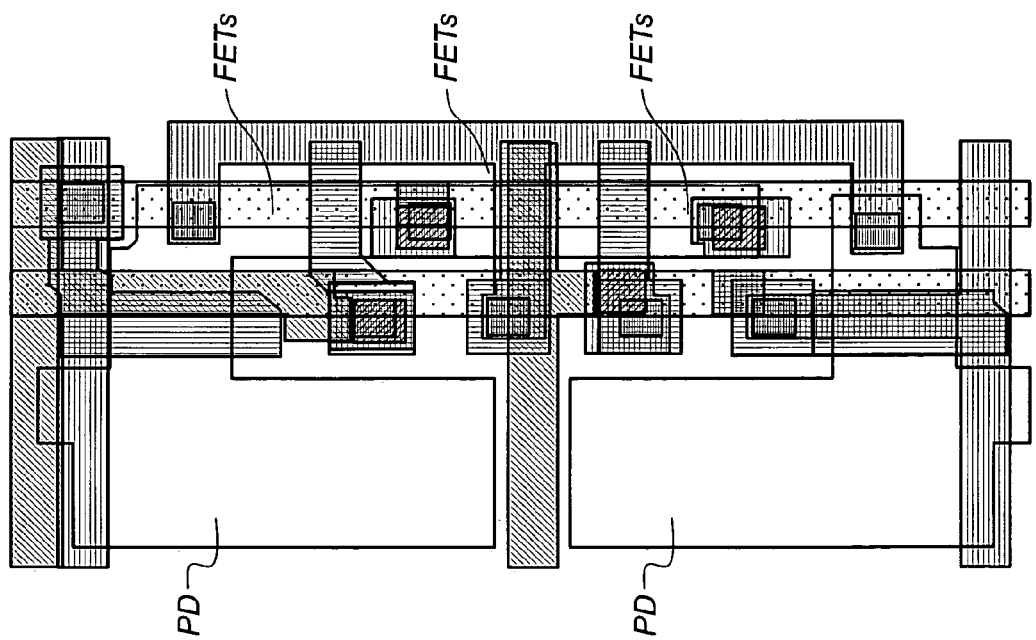
FIG. 3 is a top view of FIG. 1.
Figure 5:
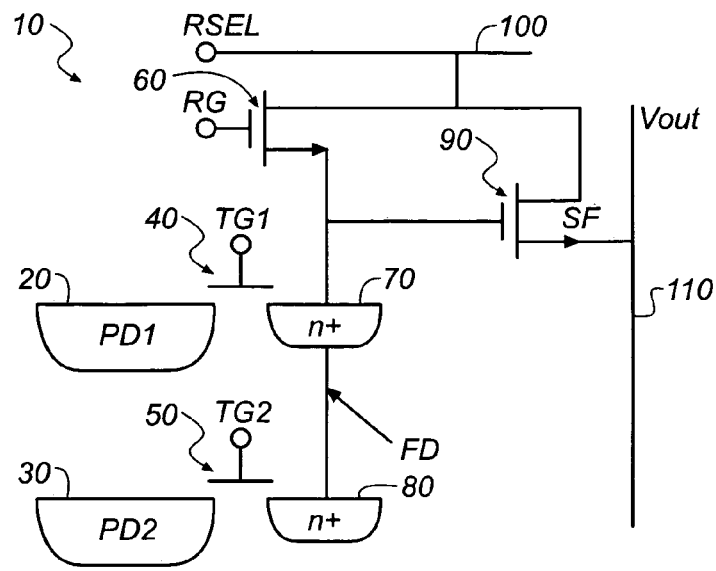
FIG. 5 is a schematic diagram of the image sensor of the present invention illustrating two photodiodes sharing an amplifier.

Referring to FIG. 5, there is shown a schematic diagram of the image sensor 10 of the present invention having two photodetectors, preferably photodiodes (PD1 and PD2) 20 and 30 that each accumulate charge in response to incident light. Two transfer gates (TG1 and TG2) 40 and 50 are respectively electrically connected to each photodiode 20 and 30, and the transfer gates 40 and 50 are pulsed sequentially with a voltage for transferring the charge from the photodiode to its associated floating diffusion, which converts the charge to a voltage signal. A reset transistor (RG) 60 sets the voltage of each floating diffusion (n+) 70 and 80 to a reference voltage prior to transferring the charge from the photodiodes 20 and 30 to the floating diffusions 70 and 80.

A source follower transistor (SF) 90, or amplifier, is shared by each floating diffusion 70 and 80 for amplifying the voltage signal for output to a column bus 110. A row select signal line (RSEL) 100 selects the row for output to the column bus 110. It is noted for clarity that the transfer gates 40 and 50 are pulsed sequentially at different times so that charge from one photodiode 20 is transferred to its associated floating diffusion 70 for output to the column bus 110 via the amplifier 90 prior to transferring the charge from the other photodiode 30 for creating distinct signals for each photodiode.

Figure 6:
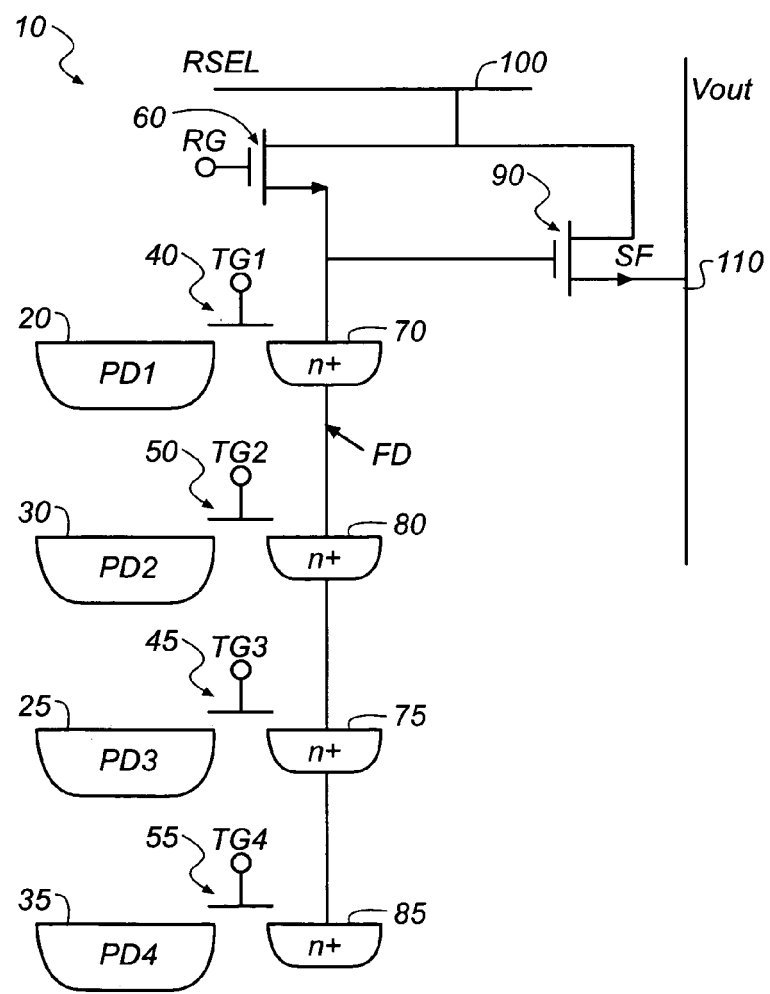
FIG. 6 is a schematic diagram of the image sensor of the present invention illustrating four photodiodes sharing an amplifier.

Referring to FIG. 6, there is shown an alternative embodiment of FIG. 5 having four photodiodes (additional photodiodes 25 and 35) sharing the amplifier 90. This embodiment functions the same as FIG. 5 with the four transfer gates 40, 45, 50 and 55 (note additional transfer gates 45 and 55) being pulsed sequentially in time for transferring charge to is respective floating diffusion 70, 75, 80 and 85 (note additional floating diffusions 75 and 85). The floating diffusions 70, 75, 80 and 85 convert the charge to a voltage and it is amplified by the source follower transistor 90 for output to the column bus 110.

Figure 7:
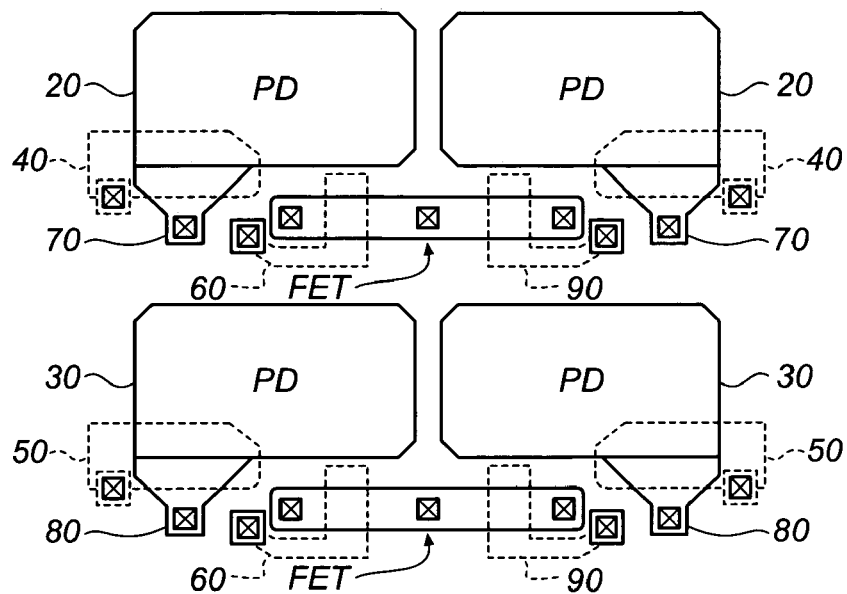
FIG. 7 is a top view of FIG. 5 illustrating the location of FETs.

Referring to FIG. 7, there is shown a top view of FIG. 5 having a plurality of photodiodes (PD) arranged in a 2×2 array. This group of four photodiodes and associated FETs constitute the pixel array unit cell. For clarity of understanding, only four photodiodes are shown, although a typical image sensor 10 of the present invention includes various size megapixel image sensors with each pixel having a photodiode. It is also noted that the Field Effect Transistors (FETs) referred to herein are the reset transistor 60 and source follower transistor 90. These FETs are designed and physically located within the unit cell to provide symmetry with respect to their proximity to each of the four photodetectors. Additionally, the FETs are placed so that the voltage applied to each transistor is preferably the same or substantially the same with respect to the electrostatic potential in the proximity of each of the photodetectors. Still further, it is noted that the FETs are functionally shared by the photodetectors (PD).

The present invention described herein provides a way to reduce the optical gain fixed pattern noise in shared amplifier pixels. Since placement of the FETs in the pixels produces p-n junctions, and these are biased to positive potentials, the FET junctions can act as weak photodetectors and collect photogenerated electrons. This is especially true in the absence of a heavy p-well around the FETs. By placing the FETs in a manner such that distance from a FET to an adjacent photodetector in the shared group or unit cell of photodetectors is identical or symmetrical (or substantially identical or substantially symmetrical) for each of the photodetectors in the unit cell, the effective quantum efficiency of all photodetectors in the unit cell will be the same or substantially similar. FIG. 7 shows the design of the present invention where the FETs are placed in a manner that each photodetector in the unit cell has a FET located next to it in a physically identical manner.

Stated differently, each photodetector includes a substantially uniform pitch therebetween, and the transistors are placed in a substantially uniform pitch in an area surrounding the photodetectors.

Figure 8:
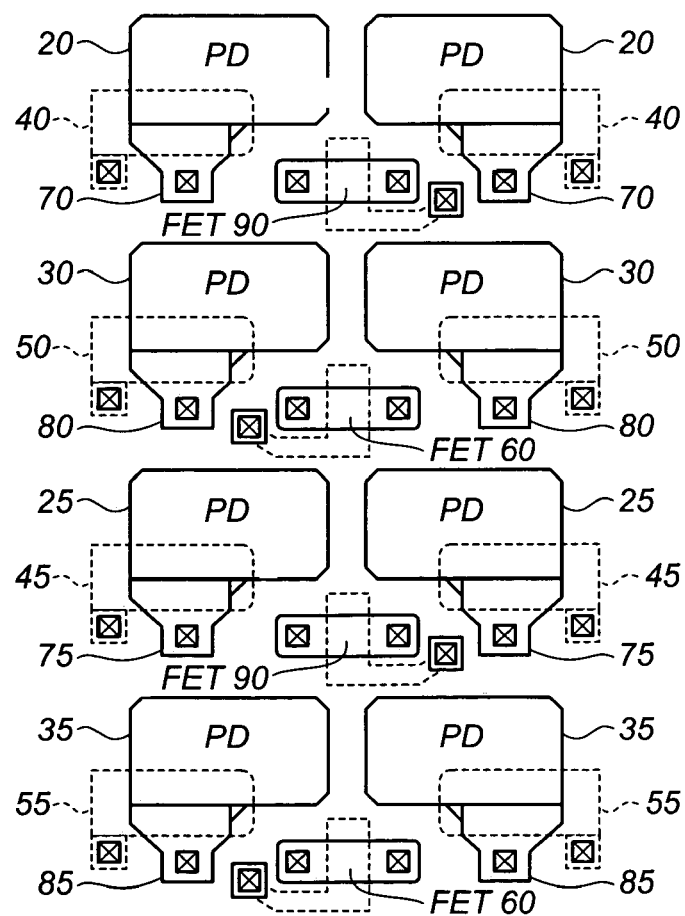
FIG. 8 is a top view of FIG. 6 illustrating the location of the FETs.

Referring to FIG. 8, there is shown a top view of FIG. 6 having a plurality of photodiodes (PD) arranged in a 2×4 array. This group of eight photodiodes and associated FETs constitute the pixel array unit cell. Again, for clarity of understanding, only eight photodiodes are shown, although a typical image sensor 10 of the present invention includes various size megapixel image sensors with each pixel having a photodiode. As above, FETs referred to herein are the reset transistor 60 and source follower transistor 90 and operate as described hereinabove. FIG. 8 shows the design of the present invention where the FETs are placed in a manner that each photodetector (PD) in the unit cell has a FET located next to it in a physically identical manner.

Figure 9:
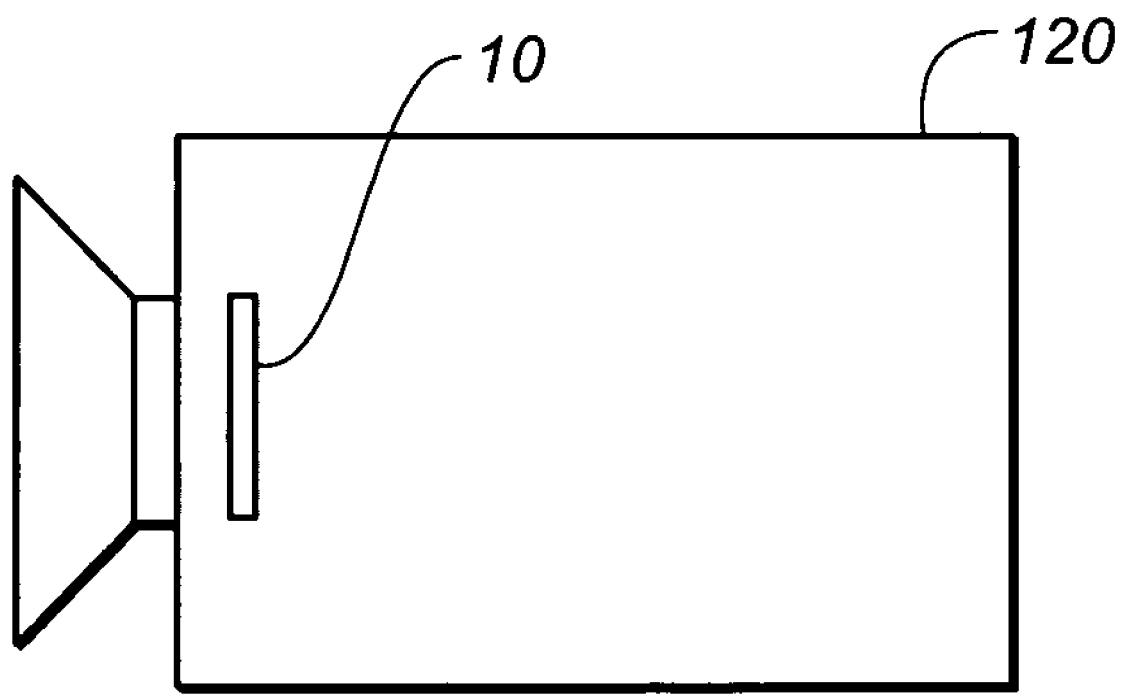
FIG. 9 is a side view of a digital camera of the present invention having the layout of FIG. 6.

Referring to FIG. 9, there is shown a side view of a digital camera 120 having the image sensor 10 disposed therein for illustrating a typical commercial embodiment to which the ordinary consumer is accustomed.

The invention has been described with reference to a preferred embodiment. However, it will be appreciated that variations and modifications can be effected by a person of ordinary skill in the art without departing from the scope of the invention.

PARTS LIST 10 image sensor
20 photodiode
25 photodiode
30 photodiode
35 photodiode
40 transfer gate
45 transfer gate
50 transfer gate
55 transfer gate
60 reset transistor
70 floating diffusion
75 floating diffusion
80 floating diffusion
85 floating diffusion
90 source follower transistor or amplifier
100 row select signal line
110 column bus
120 digital camera

The invention claimed is:

1. An image sensor comprising:
   (a) a plurality of photodetectors arranged in an array; and
   (b) a plurality of transistors that are functionally shared by two or more photodetectors and which selectively act on the charge on the two or more photodetectors to produce a signal, wherein each photodetector includes a substantially uniform pitch therebetween, and the transistors are placed in a substantially uniform pitch in an area surrounding the photodetectors such that a distance between any point on a photodetector to any point on a transistor is substantially the same as any like point on another photodetector to any like point on a corresponding transistor.

2. The image sensor as in claim 1, wherein the distance of each photodetector to a plurality of functionally shared transistors is substantially the same.

3. The image sensor as in claim 1, wherein a potential applied to each transistor is substantially the same.

4. The image sensor as in claim 2, wherein a potential applied to each transistor is substantially the same.

5. A digital camera comprising:
   an image sensor comprising:
   (a) a plurality of photodetectors arranged in an array; and
   (b) a plurality of transistors that are functionally shared by two or more photodetectors and which selectively act on the charge on the two or more photodetectors to produce a signal, wherein each photodetector includes a substantially uniform pitch therebetween, and the transistors are placed in a substantially uniform pitch in an area surrounding the photodetectors such that a distance between any point on a photodetector to any point on a transistor is substantially the same as any like point on another photodetector to any like point on a corresponding transistor.

6. The digital camera as in claim 5, wherein the distance of each photodetector to a plurality of functionally shared transistors is substantially the same.

7. The digital camera as in claim 5, wherein a potential applied to each transistor is substantially the same.

8. The digital camera as in claim 6, wherein a potential applied to each transistor is substantially the same.

* * * * *